United States Patent
Acar et al.

(10) Patent No.: US 6,842,714 B1
(45) Date of Patent: Jan. 11, 2005

(54) METHOD FOR DETERMINING THE LEAKAGE POWER FOR AN INTEGRATED CIRCUIT

(75) Inventors: Emrah Acar, Austin, TX (US); Anirudh Devgan, Austin, TX (US); Ying Liu, Austin, TX (US); Sani R. Nassif, Austin, TX (US); Haihua Su, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/646,426

(22) Filed: Aug. 22, 2003

(51) Int. Cl.$^7$ .......................... G01R 21/00; G06F 19/00; G06F 15/00
(52) U.S. Cl. .......................... 702/136; 702/60; 702/64
(58) Field of Search .......................... 702/59, 60, 64, 702/130, 136; 716/17, 18

(56) References Cited

U.S. PATENT DOCUMENTS 6,721,927 B2 * 4/2004 Croce et al. .................. 716/4

2003/0034825 A1 * 2/2003 Hsu et al. .................. 327/530
2003/0094661 A1 * 5/2003 Miyagi .................. 257/391

* cited by examiner

Primary Examiner—Bryan Bui
(74) Attorney, Agent, or Firm—Richard F. Frankeny; Winstead Sechrest & Minick P.C.; Casimer K. Salys

(57) ABSTRACT

A method for determining full chip leakage power first estimates leakage power and dynamic power for each circuit macro. The power supply voltage to each macro is first assumed to be nominal. The power dissipation for each macro is modeled as a current source whose value is the estimated power divided by the nominal power supply voltage. The power distribution network is modeled as a resistive grids. The thermal environment of the IC and its electronic package are modeled as multi dimensional grids of thermal elements. Algebraic multi-grid (AMG) methods are used to calculate updated circuit macro voltages and temperatures. The macro voltages and temperatures are updated and updated leakage and dynamic power dissipation are calculated. Iterations are continued until leakage power converges to a final value.

22 Claims, 9 Drawing Sheets

Both Voltage and Temperature Dependencies

Only Voltage Dependency

Only Temperature Dependency

US 6,842,714 B1

METHOD FOR DETERMINING THE LEAKAGE POWER FOR AN INTEGRATED CIRCUIT

TECHNICAL FIELD

The present invention relates in general to methods and algorithms for determining the full chip leakage power of an integrated circuit (IC).

BACKGROUND INFORMATION

With continuous shrinking of minimal feature size, leaky current is expected to become a major challenge for future complementary metal oxide silicon (CMOS) designs. Although each is about 10% of total chip power for the current generation of CMOS technology, the number is expected to rise to 50% for next generation techniques. The increasing leakage current not only poses a problem for battery powered devices, such as mobile and hand-held electronics, it is increasingly critical for active operation as it is becoming a higher percentage of total power.

Most of the leakage estimation and reduction techniques have focused on sub-threshold leakage due to the lowering of the power supply voltage and the accompanying reduction of the threshold voltage. With the reduction of the gate oxide thickness, the gate leakage current can no longer be ignored. Gate leakage is on a trend to become comparable to the sub-threshold leakage. An accurate full chip leakage estimation needs to consider both gate and sub-threshold leakage.

There are various methods that have been used to estimate the full chip leakage; for example, a linear regression model may estimate full chip leakage based on the gate count in the application specific integrated circuit (ASIC) environments. It is known that the leakage current has strong dependency on the environmental factors, such as device channel temperature, power supply voltage and workload. However, most methods for determining leakage have not taken these parameters into consideration. The dependency of leakage on temperature has an order somewhat greater than linear, for example, a 30° C. change in temperature may affect the leakage by 30%. The dependency of leakage on power supply voltage is exponential; a 20% fluctuation in Vdd may affect the leakage power by more than a factor of two.

Chip designers use empirical methods to estimate leakage power, which assumes a uniform temperature and Vdd distribution across the whole chip. However, in today's complex industrial designs, both temperature and Vdd fluctuations have very strong locality, i.e., they are not uniform across the chip. The exact amount of the fluctuations at certain locations depends on the distribution of the transistors and decoupling capacitors, the workload, as well as the quality of the power grid and package design. Empirical methods in full chip leakage estimation are too simplistic, and thus inaccurate.

Therefore, there is a need for a method for determining the leakage power of a full chip IC that considers the effects of temperature and voltage distribution across the IC.

SUMMARY OF THE INVENTION

A method for determining the full chip leakage power of an IC begins by making an estimate of the leakage power as well as the dynamic power for circuit macros (hereinafter defined) or macros making up the IC. Using these estimates, each macro's power is modeled as a current source whose value is set to the power of the macro divided by the nominal power supply voltage. The voltage and ground distribution grids delivering power to the macros are modeled as a grid matrix of resistor elements. Package power distribution may be modeled as resistive grids or by networks or resistors and inductors. A linear matrix solver, such as the algebraic multi-grid (AMG) method, is used to calculate an actual voltage for each circuit macro using the thermal resistance models for the electronic package as well as resistor matrix models for the voltage and ground grids.

Since circuit macro power dissipation, leakage as well as dynamic, may be dependent on the local temperature of the circuit macros, the thermal characteristics of the IC, including its electronic packaging and its heat sink design, are also modeled using heat equations and a matrix of thermal elements. A linear matrix solver is used to calculate local temperatures for the circuit macros. Using the calculated voltage for each macro, leakage and dynamic power for the macro are determined using estimated macro workloads, switching factors, as well as the calculated local temperatures. Since temperature and power dissipation are cross dependent, the process is iterated. Each iteration is tested for convergence to determine when to stop the calculation process, and the final values for leakage power are used in the IC design process.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
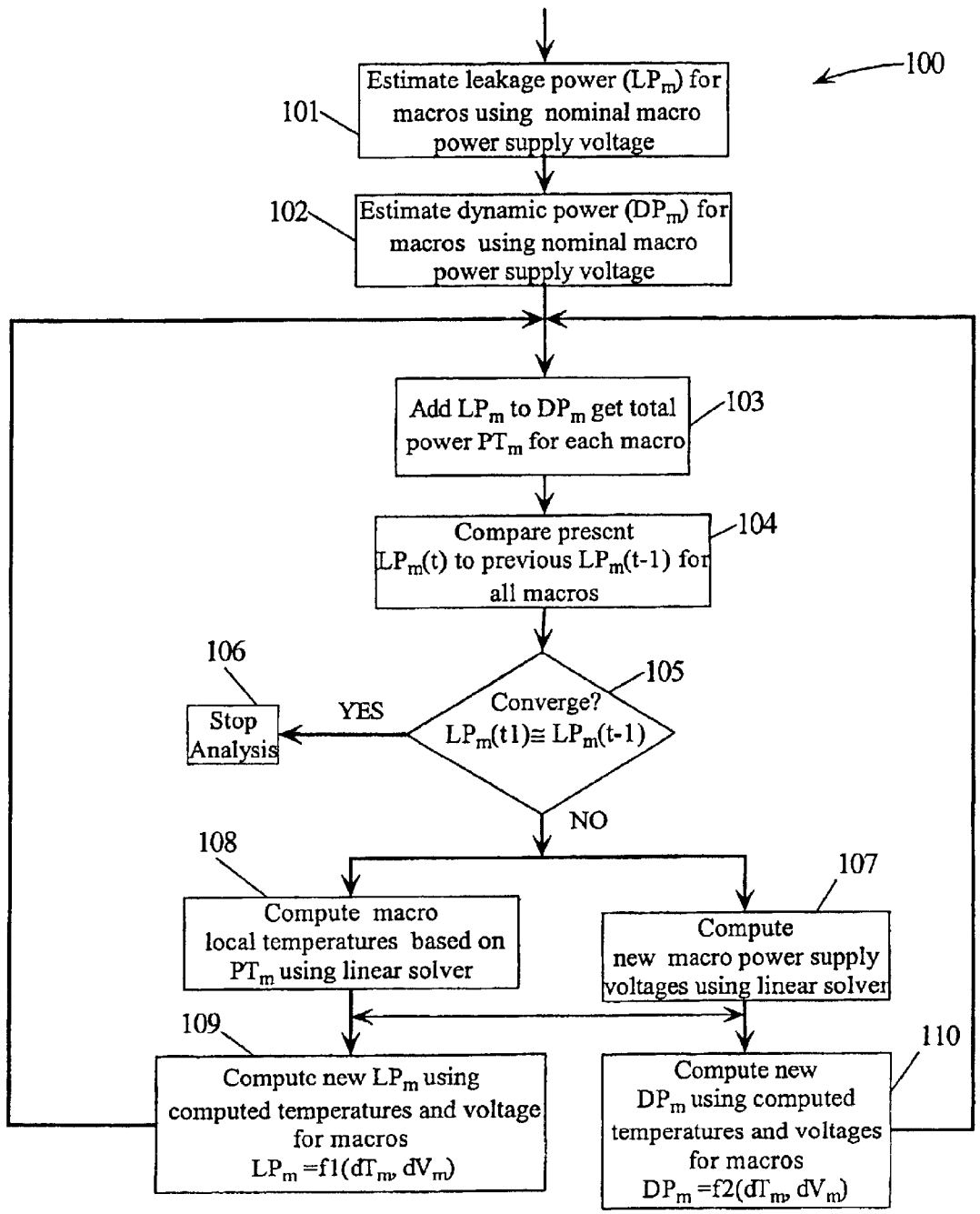
FIG. 1 is a flow diagram of method steps used in embodiments of the present invention.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, data formats within communication protocols, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views. In the following, a convergence of an iteration means that the variable being calculated differs from a previously calculated value by a known, small percentage, for example, a few percent depending on the accuracy desired. In the following, a group of logic circuits that perform a certain function may be referred to as a circuit macro or simply a macro.

Multi-grid methods are state-of-the art linear matrix solver techniques used to solve large systems of linear equations Ax=b, where $A \in R^{n \times n}$ and $x, b \in R^n$. This system can be represented as a graph of n nodes where an edge (i,j) represents a non-zero coefficient. The basic idea of the multi-grid method is to define a hierarchy of grids, for example, coarse to fine. Each node at the coarser grid level represents a set of nodes at the finer level. Coefficients at some grid level i are derived from coefficients at grid level i+1 (prolongation) or from coefficients at grid level i−1 (restriction). The grid hierarchy is traversed in V or W-cycles. On each level of the hierarchy an iterative solver is used.

This solver usually is referred to as the "smoother". The error function b−Ax may be considered as a superposition of sine waves of different wavelengths. Multi-grid theory states that the smoother does a good job of reducing those components of the error function whose wavelength is short with respect to the grid width while it is unable to reduce long wavelength components. The iterative solver alone therefore is unable to achieve convergence.

Multi-grid methods only run a number of iterations of the smoother that is sufficient to reduce the short wavelength components. Since a wavelength that is long with respect to the fine grid is short with respect to some coarser grid, traversal of the grid hierarchy and application of the smoother reduces all components of the error function. To achieve convergence, it is mandatory that an exact solution is computed at the coarsest grid level. Since the number of nodes at the coarsest grid level typically is very small, a direct solver like Gauβ-Seidel may be used to determine the solution.

As an example, coarse grids may be determined from fine grids by omitting every second node in each direction. If the grid does not have such a regular structure (which corresponds to a band structure in matrix A), the situation is more complex. In geometric multi-grid methods, coarse grids are determined based on geometry information (such as grid spacing) alone. In contrast, algebraic multi-grid takes into account coefficient values, too. Multi-grid theory states that the "smoother" reduces error components in the direction of strong coefficients. A coefficient is said to be strong if its absolute value is close to the maximum absolute value of all coefficients of that node. Therefore, coarsening should proceed into the strong coefficient direction. An algebraic multi-grid (AMG) solver is the key component of CFX-TfC, an industrial Computer Fluid Dynamics (CFD) package that has been parallelized within the scope of the project, "Software Engineering Methods for Parallel Applications in Scientific Computing" (SEMPA). In addition, an object-oriented re-design of AMG has been completed in the SEMPA project. CFX-Tfc is an industrial CFD package developed and marketed by AEA Technology GmbH. CFX-TfC solves the Navier-Stokes equations in three dimensional space. The software may be applied to a wide range of problems.

The method of the present invention utilizes linear solver methods to arrive a solution using iteration. The process starts with an estimate for the total power for each circuit macro. Multi-dimensional models of the power distribution network and the heat transfer network are then used to converge to an actual leakage power for the circuit macros. Once the voltage drops and temperature variations at each macro are known, the originally estimated power is adjusted, for both dynamic and leakage components determining leakage power. However, power grid voltage drops and temperature changes also depend on circuit power consumption (both dynamic and leakage power), which in turn is the source of the voltage and temperature variation. A complete analysis of this nonlinear coupling behavior often requires a Newton-Raphson iteration, which may not be practical for current large scale integrated circuits (ICs). The present invention uses iteration-based linear solvers (e.g., AMG) to generate sufficient accuracy at a significantly improved computational efficiency.

Various chip level power grid methodologies de-couple the linear (power grid) and nonlinear portion (switching devices, e.g., transistors) of the whole system as follows: First, the total power of each macro comprising nonlinear devices is estimated assuming perfect power supply voltages (Vdd and ground). Usually the average workload with reasonable switching factor is used to calculate the total power. An average leakage power can also be calculated for each circuit macro or macro. Next, independent current sources, used to represent power dissipated by each macro, are applied to the power grid. The values of the current sources are set as: total power/Vdd (at each macro). Based on this methodology, the general power distribution network may be modeled as follows:

The power grid is modeled as a resistive mesh with via resistors connecting metal layers.

The loads (circuit macros) are modeled as distributed independent current sources in parallel with parasitic capacitors connected between Vdd and ground.

The decoupling capacitors (D-caps) are modeled as single lumped capacitors connected between Vdd and ground.

The top level metal is connected to an electronic package model with inductors or resistor/inductor elements connected to ideal constant voltage sources.

Figure 2:
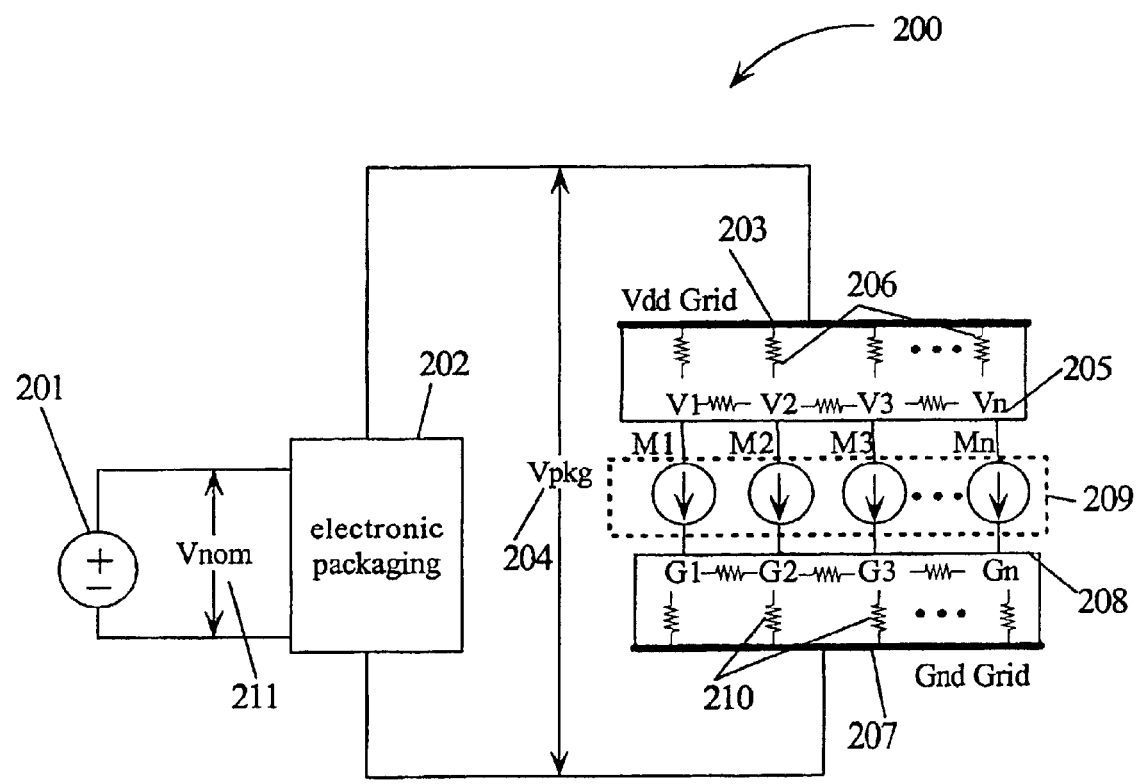
FIG. 2 is a block diagram of power distribution network modeling used in embodiments of the present invention.

Leakage power estimation may only consider the DC voltage drops across the whole chip. Therefore, the entire power distribution network may be reduced to multiple layers of close-coupled meshes of resistor elements. If more accuracy is desired, a resistive package model may be attached between the top level metal layer and ideal voltage sources modeling the voltage regulator. The power distribution network, therefore, becomes a large scale linear circuit 200 as a shown in FIG. 2, in which the electronic package 202, Vdd grid 203, and ground (Gnd 207) are each represented by large resistive meshes illustrated by exemplary resistors 206 and 210 for the two grids respectively. The power supply (not shown) is represented by a voltage source 201 generating nominal voltage (Vnom) 211. The electronic packaging 202 represents the power distribution network that delivers the voltage Vpkg 204 across the Vdd grid 203 and the Gnd grid 207. The macro voltage potentials 205 (V1–Vn) and ground potentials 208 (G1–Gn) determine the local voltages which are across each macro represented by current sources 209 (M1–Mn).

Because of circuit density, a typical power distribution network may have millions of nodes. Since the power distribution model may have such a large number of nodes, traditional numerical analysis methods may easily exceed memory capacity or the process of computing a solution may become extremely slow.

In embodiments of the present invention, the iterative algebraic multi-grid (AMG) linear solver is used. AMG works directly on matrix stamps and hierarchically creates a coarsened grid with a reduced number of nodes. Solving the node equations for the coarsened grid results in an exact solution which may be attained very efficiently. The solution at the most coarse grid is then mapped back to the fine grid wherein a restricted number of iterations reduce the high frequency error components produced during the reduction and interpolation process. Using AMG, a power grid with multi-million nodes may be solved within a couple of minutes. An explanation of this method may be found on the Internet (Luksch, Peter. "Algebraic Multigrid," via Internet at www.bode.cs.tum.edu/Par/appls/apps/amg.html).

Given the voltage solution at every grid point and the set of power supply voltage and ground nodes that each circuit macro are attached to, an average "compression" voltage between the power supply voltage and ground voltage for each circuit macro may be determined. The leakage power of each macro may be updated using this voltage drop value to determine the voltage across each circuit macro. The leakage power is updated based on a leakage model according to embodiments of the present invention explained in detail in the following sections.

Dynamic power dissipation for each circuit macro also changes as the macro's Vdd changes due to drops in the resistive voltage and ground grids. Total power, which is the sum of dynamic power and leakage power, also affects the local temperature for each macro. Depending on the desired accuracy for an analysis, the dynamic power may be assumed to be independent of temperature. In embodiments of the present invention, the following simple mathematical model is used to update the dynamic power when Vdd changes.

$$P_S = P_{SO} \cdot (1 + 2\Delta V/Vdd + (\Delta V/Vdd)^2)$$

However, it is understood that using temperature dependent dynamic power calculations is within the scope of the present invention.

Figure 3:
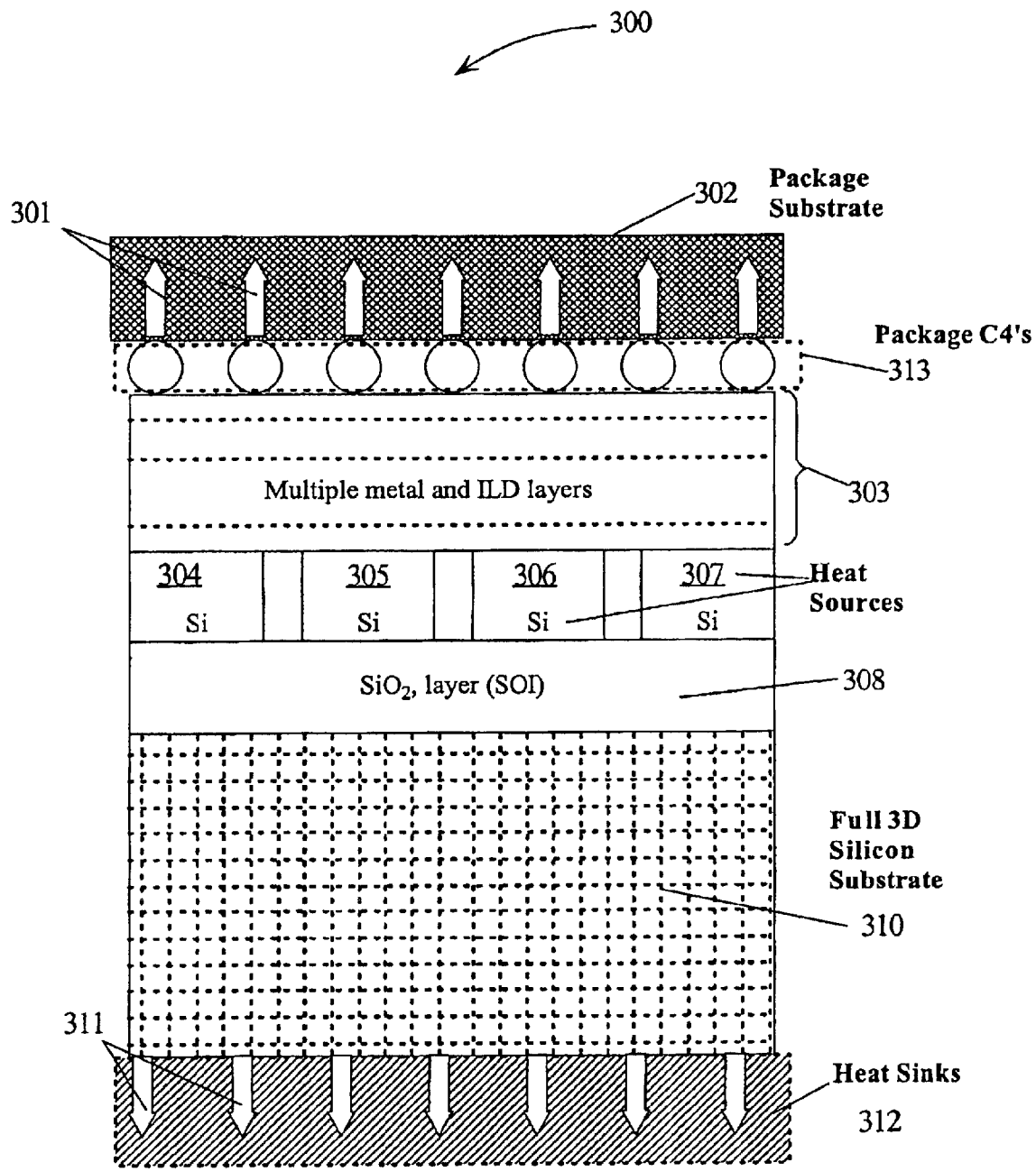
FIG. 3 is a block diagram of a thermal distribution model used in embodiments of the present invention.

FIG. 3 is a block diagram of a multi-dimensional thermal model 300 of an IC and its heat sinks 312 and electronic substrate packaging 302. The IC in FIG. 3 comprises multiple metal and inner layer dielectrics (ILDs) 303, various macros shown as heat sources 304–307, silicon-on-insulator (SOI) layer 308, and silicon substrate 310. Packaging C4's solder balls are the primary conduction path for heat flow 301 from heat sources 304–307 through metal and ILD layers 303. Likewise, heat sinks 312 conduct heat flow 311 from the back side of the IC (opposite circuit side) that is attached to the heat sinks 312.

Similar to power grid analysis, the electrical (power) and thermal simulations may be coupled to compute the chips thermal profile. A general 3D thermal analysis involves solving the following heat conduction equation:

$$\rho c_p \frac{\partial T(x,y,z,t)}{\partial t} = \nabla[k(x,y,z,T)\nabla(x,y,z,t)] + g(x,y,z,t) \quad (1)$$

Equation (1) is subject to the general boundary condition:

$$k(x,y,z,t)\frac{\partial T(x,y,z,t)}{\partial n_i} + h_i T(x,y,z,t) = f_i(x,y,z) \quad (2)$$

In Equation (2), T is the temperature, g is the power density of heat sources, k is the thermal conductivity, and ρ is a density of the material, $c_p$ is a specific heat, $h_i$ is heat transfer coefficient on the boundary, $f_i(x, y, z)$ is a function of position and n is the outward direction normal to the surface i. In steady state analysis, $$\frac{\partial T}{\partial t} = 0.$$

Also within the range of working temperature, the thermal conductivity of various materials and inside an IC (silicon, silicon dioxide, metals and interlayer dielectrics (ILDs)) may be regarded as constants, therefore, Equation (1) becomes:

$$k\nabla^2 T(x,y,z) + g(x,y,z) = 0 \quad (3)$$

In Equation (3), g(x, y, z) is the power density of devices at the surface of the silicon layer, including both the dynamic and the leakage power dissipations.

Depending on the type of electronic packaging (and location of heat sinks) and the surrounding environment, the following three types of chip boundary conditions may be derived from Equation (2):

1) Isothermal (Dirichlet) boundary condition: T=$f_i$(x, y, z), where $f_i$(x, y, z) corresponds to temperatures at the heat sinks. Generally the heat sink is attached to the back side of the substrate.

2) Insulated (Neumann) boundary condition:

$$\frac{\partial T}{\partial t} = 0,$$

where $n_i$ corresponds to directions to the four side surfaces of the chip assuming they are perfectly insulated.

3) Convective (Robin) boundary condition:

$$k_i \frac{\partial T}{\partial t} = h_i(T - T_a)$$

where $T_a$ is the ambient temperature. This condition is needed to derive an accurate heat sink and package thermal model.

A finite difference technique is often applied to solve above heat conduction Equation (3) with particular boundary conditions. Accordingly, an equivalent thermal resisted network may be constructed. If the thermal conductivity is k, then the typical thermal resistance of a cube with a volume dx·dy·dz in the direction x is:

$$R_i = \frac{dx}{k\,dy\,dz}$$

Likewise the resistance at the convective boundary with heat transfer coefficients $h_b$ is:

$$R_b = \frac{1}{h_b dy dz}$$

Based on the above equations, a full chip thermal model may be constructed which includes all the layers as well as the heat sink and controlled collapse circuit connects (C4's). For a typical commercial chip, the size of the problem needed for the thermal solution may also be quite large. Embodiments of the present invention employ AMG solver to solve the thermal model to obtain local temperatures for each circuit macro.

While a full three dimensional (3D) chip model may result in a huge system of equations, various simplification techniques have been developed to simplify the analysis while still maintaining a sufficient amount of accuracy for the temperature solution at the silicon (device) layer, wherein the temperature variations are to be used to estimate individual circuit macro leakage power. A summary of the simplification techniques applied to the chips structure shown in FIG. 3 is as follows:

1) Mixed 1 dimensional (1D) and 3D thermal modeling introduced in reference [3]. First, a full 3 dimensional substrate model is applied to increase the accuracy. Second, the packaging heat sinks are treated as a 1 dimensional thermal resistances.
2) Dense devices are assumed to occupy the entire silicon layer. According to the model of (1), the thermal resistors in the silicon layer are calculated using the thermal conductivity of silicon.
3) Equivalent thermal resistances model in the metal layers, interval layer dielectric (ILD) layers and C4's. The equivalent thermal resistance in the metal is adjusted according to the metal density of the metal layers. Similarly, the equivalent thermal resistance in the ILD is adjusted according to the via density between adjacent metal layers or the contact density between the lowest metal layer and the circuit devices. The thermal resistance at the C4's may be estimated using the technique introduced in reference [6].
4) Ideal temperature is assumed within the heat sinks and the electronic package.

Similar to the case for calculating power supply voltage distribution, assuming a temperature at each volume on the device layer, an average temperature variation among all volumes to which a circuit macro is attached may be obtained. The total leakage power of this macro is updated according to this temperature value and based on a leakage model described in the following section.

To create an accurate leakage model with respect to temperature and supply voltage fluctuation, "Simulation Program with Integrated Circuit Emphasis" (SPICE) is used to simulate standard cells with accurate Berkeley Simulation (BSIM) and Silicon On Insulator (SOI) device models. Both $I_{sub}$ and $I_{gate}$ are included in the simulation. Each cell is simulated at different temperature and supply voltages and the average leakage each temperature Vdd node is calculated. It has been determined that the Vdd dependency of the leakage power is exponential while the leakage power temperature dependency has an order greater than linear. Power supply voltage variations across the chip are typically no more than 20% or 30% of the nominal power supply voltage. Hence, even though the dependency of power supply on leakage is exponential, it can be modeled as a polynomial around its nominal value. Embodiments of the present invention use a second-order polynomial to mathematically model the dependency of leakage power on local power supply voltage variation. The coefficients of the polynomial are calculated by regression. The mathematical model may be in the form of:

$$\frac{I_{leak}(\Delta T, \Delta V)}{I_{leak}(0, 0)} = \qquad (4)$$
$$1 + a_1 \cdot \Delta T = a_2 \cdot (\Delta T)^2 + b_1 \cdot \Delta V + b_2 \cdot (\Delta V)^2 + c_2 \cdot (\Delta T)(\Delta V)$$

Figure 4:
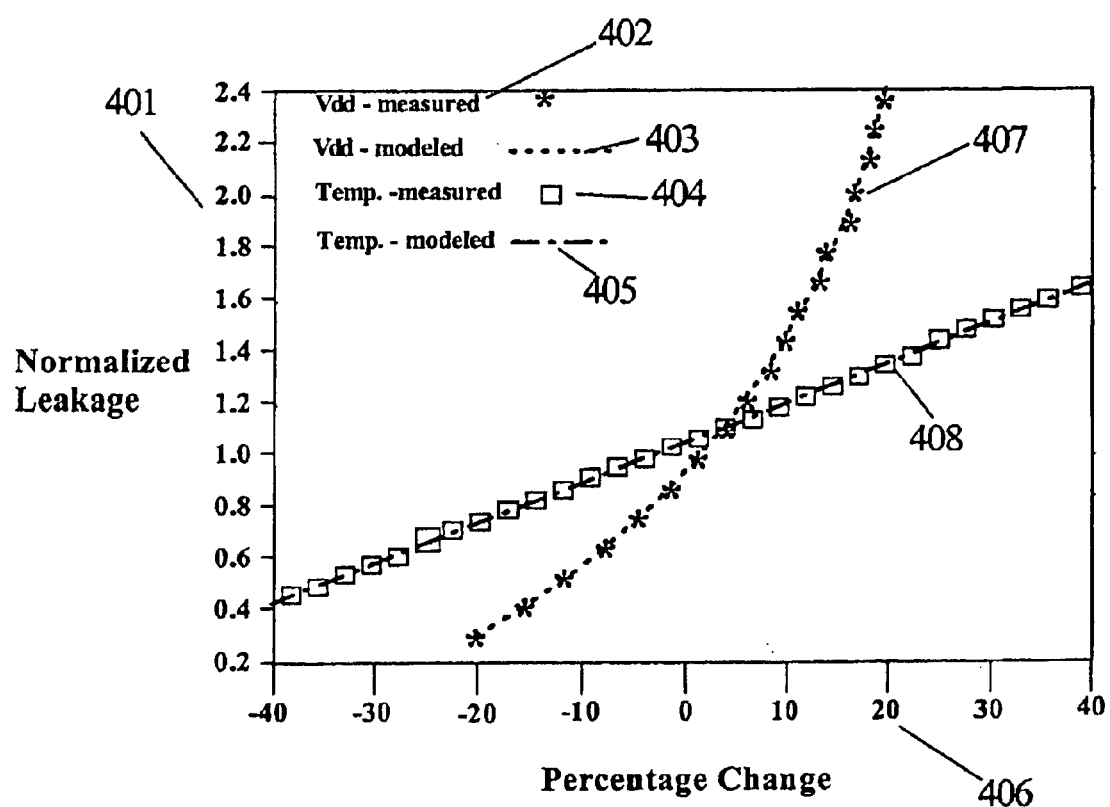
FIG. 4 is a diagram that illustrates a relationship between leakage current and temperature and power supply voltage for both modeled and measured cases.

For different standard cells, the coefficients in the mathematical model (4) may be slightly different, but observation has shown the differences are very small. Mathematical model (4) has been verified using all ISCAS benchmark C17 circuits and a graphical representation of the verifications are shown in FIG. 4 where normalized leakage 401 is plotted as a function of percentage change 406. In FIG. 4, the line style used to plot Vdd measured 402, Vdd modeled 403, temperature measured 404 and temperature modeled 405 is shown in the legend. The combined plots (measured and modeled) of leakage as a function of Vdd (407) and leakage as a function of temperature (408) are also shown. FIG. 4 clearly shows the exponential dependency of the leakage on Vdd and the near linear dependency of leakage on temperature as stated earlier. The data graphed in FIG. 4 also shows that the disclosed model is quite accurate in a given range of fluctuations.

FIG. 1 is a flow diagram of method steps used in embodiments of the present invention. In step 101, the leakage power (LP) for the macros making up an integrated circuit (IC) are estimated using a nominal power supply voltage and nominal temperature at all macros. In step 102, the dynamic power (DP) for the macros are estimated again using a nominal power supply voltage and nominal temperature at all macros. In step 103, the total power (TP) for each macro is determined by adding DP and LP as estimated for each macro. Then in step 104, the TP determined in step 103 is compared to a previous TP determined in a previous pass through step 103. If two successive TPs are close in value (e.g., within a few percent), then the iteration may be considered as converged. In the first iteration, there is no previous TP, therefore, there is no convergence. In step 105, a test is done to determine if the calculated LP is considered as converged. If convergence is established, then in step 106 the analysis may be terminated. If there is no convergence, then in step 107 additional calculations are completed.

In step 107, a new macro power supply voltage for each macro is computed using a linear solver (e.g., AMG) applied to the multiple dimensional electrical resistive grid model for the power distribution network on the IC. For this calculation, each macro is represented as a current source whose value is equal to the previous TP (for first pass it is the estimated total power) for the particular macro divided by the previous power supply voltage (for the first pass it is the nominal power supply voltage. Likewise in step 108 local temperatures are calculated using a linear solver (e.g., AMG) applied to the multi-dimensional thermal resistive grid models for the IC, the heat sink, and the electrical packaging. In step 108 all of the macros become heat sources dissipating LP and DP. The multi-dimensional thermal model is then to calculate the local temperatures for each macro. In step 109, a new value for LP for each macro is computed using the macro power supply voltages and local temperatures determined in steps 107 and 108, respectively. The LP for each macro is dependent on both temperature and voltage. Likewise, in step 109, a new value for DP for each macro is computed using the macro power supply voltages and local temperatures determined in steps 107 and 108, respectively. The DP for each macro generally is dependent on both temperature and voltage, however, it may be considerably more dependent on voltage than on temperature. The computed LP and DP from steps 109 and 110 are saved and a branch is taken back to step 103 where steps 103, 104, 105 and 107–110 are repeated again until the test in step 105 indicates that the LP converges in which case step 106 is executed to stop the analysis.

The following presents the analysis results of several industry chips using embodiments of the present invention. The leakage estimation flow, along with the power grid and thermal simulation engine, has been implemented using the C++ programming language. All the experiments are run on the Intel Pentium III 700 MHz machine with 4 GB memory, running Linux® Operating System (OS).

TABLE 1

Runtime performance and memory usage of our power grid and thermal analysis engine. IR is power grid analysis and TH represents thermal analysis.

| Matrix size | # non-zeros | analysis type | CPU (sec) | Mem (GB) |
|---|---|---|---|---|
| 0.17 M | 1.12 M | TH | 82.13 | 0.45 |
| 0.27 M | 1.76 M | TH | 139.17 | 0.61 |
| 0.63 M | 3.11 M | IR | 88.39 | 0.46 |
| 1.74 M | 8.89 M | IR | 293.58 | 1.3 |
| 2.73 M | 13.9 M | IR | 438.1 | 2.1 |

The CPU time and memory usage of the power grid and thermal analysis tool according to embodiments of the present invention are shown for several chips that are listed in Table 1.

The next two designs (chip 1 and chip 2) are based on the 0.13 $\mu$m commercial CMOS SOI technology. Chip 1 has approximately 160K macros, with the size of around 8 mm by 8 mm. The initial total chip power is 48W, out of which 9.6W (20%) is roughly estimated as leakage power. Chip 2 is the CPU core of a microprocessor design. Chip 2 occupies 2.5 mm by 4.7 mm with a total power of 5.6W, out of which approximately 1.2W is leakage power. The nominal power supply voltage for each chip is 1.2 volts and 1.0 volts, respectively. A total change of leakage power due to temperature and voltage variation for both chips are listed in the following Table 2:

TABLE 2

Leakage variation after 1 iteration.

| chip | $\Delta V$ (mv) | $\Delta T$ (° C.) | $\Delta$leakage (W) |
|---|---|---|---|
| 1 | min: −4 max: −184 | min: −4.2 max: +25.4 | −1.850 |
| 2 | min: 0 max: −41 | min: −9.5 max: +4.1 | −0.136 |

The power supply voltage drops and the temperature distribution across chip 1 may be plotted as 3D distributions. Typical variation ranges from 3% to 15% of Vdd have been determined. Across the chip, the temperature variation (compared to the reference temperature at heat sinks) may range from 0.8° C. to 30.3° C. These 3D distribution plots may be used to identify "hot" spots in terms of both power supply voltage and temperature variations indicating high power density regions.

Applying the leakage power/thermal (LPT) model, according to embodiments of the present invention, the leakage power is updated based on the average supply voltage and temperature changes to each functional circuit macro. Using embodiments of the present invention, it has been observed that after one iteration the calculated leakage power of each circuit macro may become less than the estimated initial leakage power value; the leakage power ratio of estimated initial leakage power to calculated leakage power is less than one. As the leakage ratio deviates from one, the more the actual leakage power ratio varies from the initial estimation.

Figure 5:
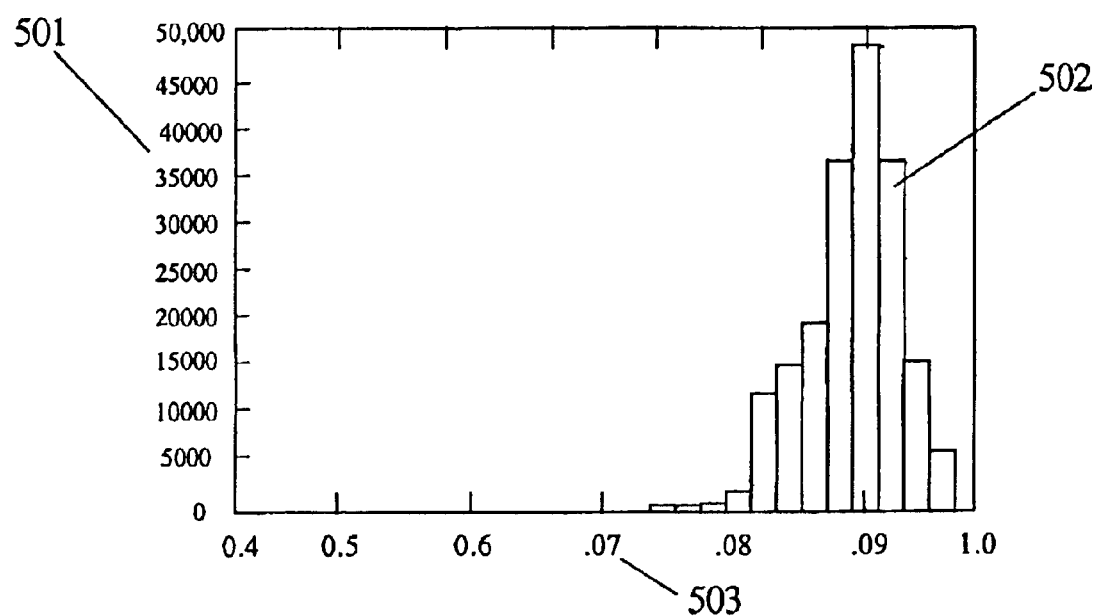
FIG. 5 is a diagram illustrating circuit blocks and their leakage variation ration for the case of both voltage and temperature dependencies.
Figure 6:
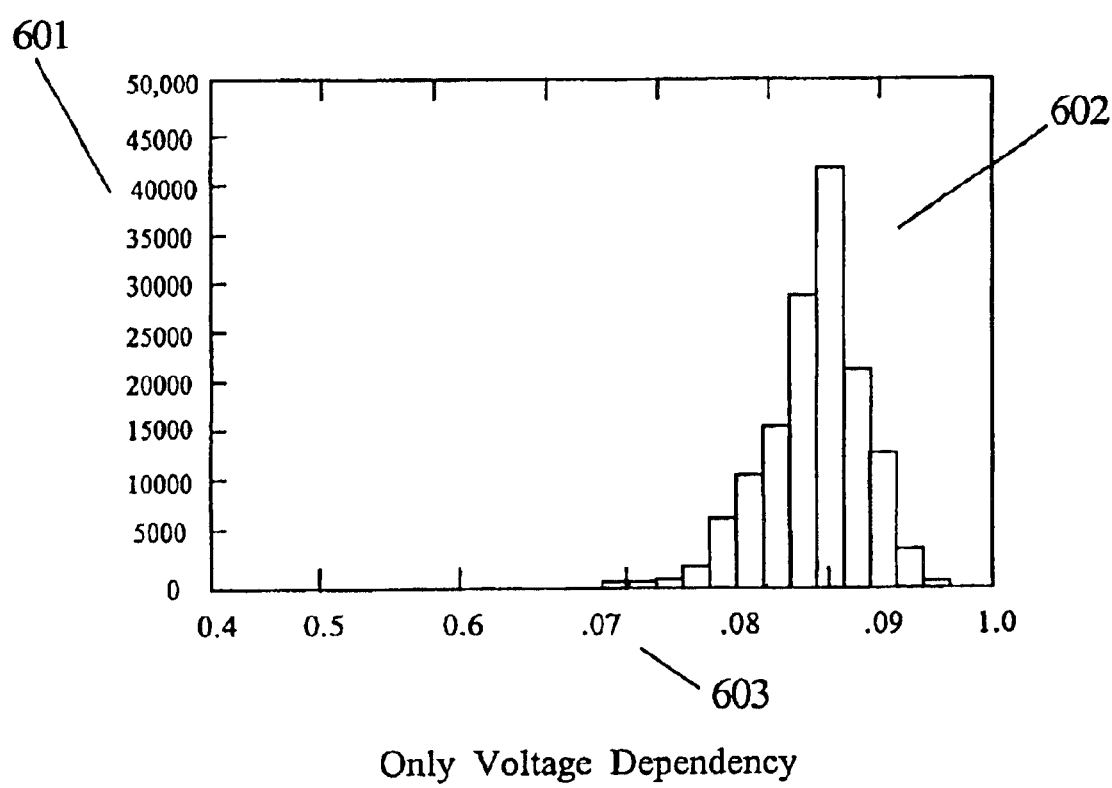
FIG. 6 is a diagram illustrating circuit macros and their leakage variation ration for the case of voltage dependence.
Figure 7:
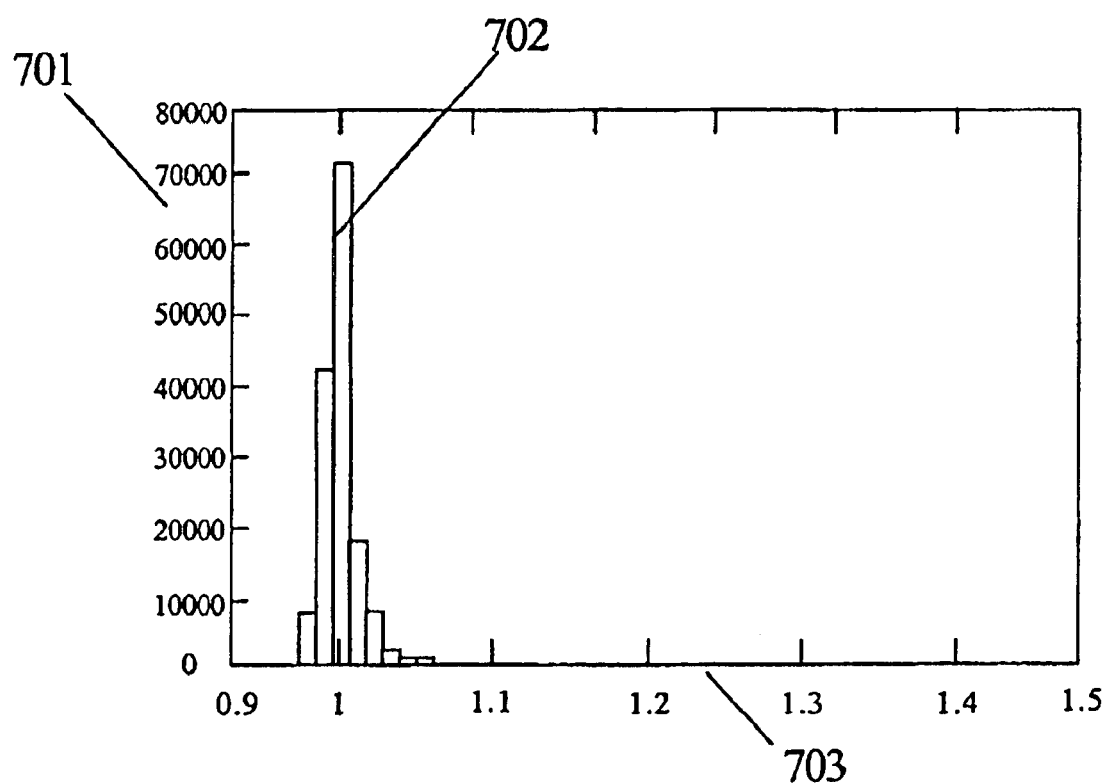
FIG. 7 is a diagram illustrating circuit macros and their leakage variation ration for the case of temperature dependence.

FIGS. 5, 6, and 7 show the distribution of macros and their leakage variation ratio defined by the ratio of updated leakage power to its corresponding, initial estimate for the three following cases: both voltage and temperature dependent (LPT), individual voltage dependent (LV) and individual temperature dependent (LT). FIG. 5 graphs numbers of macros 501 versus the ratio of updated leakage power to its corresponding, initial estimate (503) with both voltage and temperature dependencies. Distributions 502 are bar graphs centered on their particular ration value. FIG. 6 graphs numbers of macros 601 versus the ratio of updated leakage power to its corresponding, initial estimate (603) with only voltage dependency. Distributions 602 are bar graphs centered on their particular ration value. FIG. 7 graphs numbers of macros 701 versus the ratio of updated leakage power to its corresponding, initial estimate (703) with only temperature dependency. Distributions 702 are bar graphs centered on their particular ration value.

A comparison of the diagrams in FIGS. 5, 6, and 7 illustrates that the leakage power depends more on the power supply voltage variation than on the temperature variation, which confirms the applicability of a simple analytical estimation suggested earlier. The dependency of both power supply voltage and temperature variations is closely correlated and the overall effect shows that the actual leakage power is lower than the initial estimate.

Plotting the calculated leakage power variation distribution across exemplary chip 1 would clearly show that the large leakage power variation regions correspond to "hot" spots as identified in the voltage and temperature profiles, respectively. Similar plots and observations may be made for the exemplary chip 2. Although two chips may be designed and implemented in the same technology, they may have completely different leakage profiles. This implies that simply using the number of gates to estimate differences in two chip designs would not adequately account for the differences found using embodiments of the present invention.

TABLE 3

Comparison among various leakage estimation models for chip 1.

| Methods | $\Delta V$ (mv) | $\Delta T$ (° C.) | Total leakage (W) |
|---|---|---|---|
| LPT | min: −4 max: −184 | min: −4/2 max: +25.3 | 7.75 |
| LP | min: −4 max: −184 | n/a | 7.77 |
| LT | n/a | min: −4.2 max: +25.3 | 9.63 |
| EMP | −120 | 0 | 5.31 |

Table 3 shows total leakage various estimation methods after one iteration of update from the initial value. In these methods, the leakage power of each circuit macro is updated based on the power supply voltage and the temperature variation of each individual macro. For comparison reasons, results are listed for the traditional method using uniform voltage and temperature profiles. A uniform 10% Vdd drop and a uniform 85° C. profile (zero spatial temperature variation) across the chip is assumed and the numbers are listed as "EMP" in Table 3. Because it assumes a flat Vdd and temperature profile, it underestimates the full chip leakage by 30%.

Figure 8:
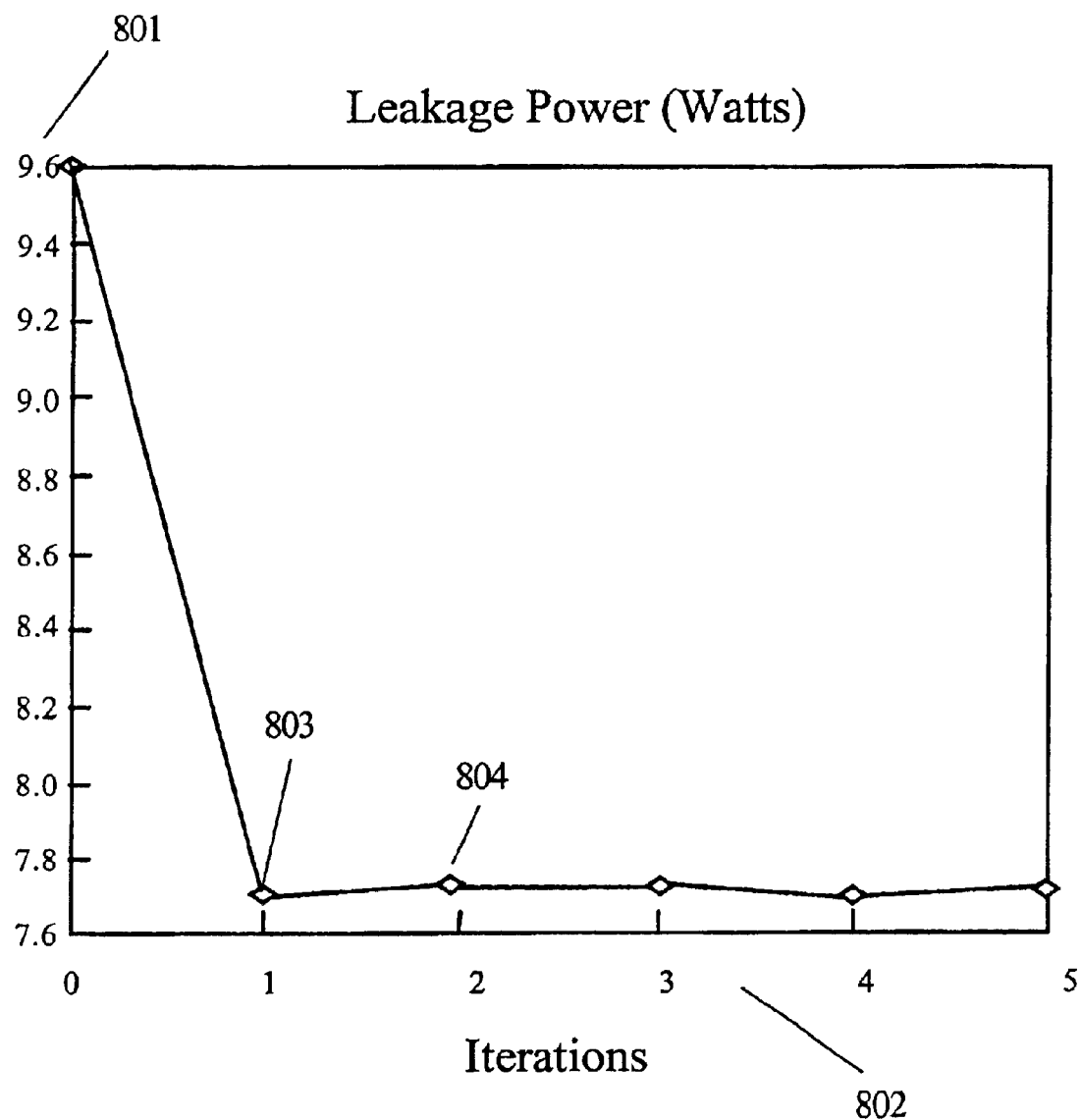
FIG. 8 is a diagram illustrating the convergence of the leakage power after five calculation iterations.

FIG. 8 shows an update of leakage power 801 for each of five iterations (802) using embodiments of the present invention. The first iteration 803 reduces leakage by 19.2%. After the first iteration, which corrects the leakage by 19%, the rest of the iterations (e.g., 804) only fine tune the result within a 0.5%. Therefore, in many cases one iteration may provide sufficiently accurate results using embodiments of the present invention to calculate full chip leakage power for an IC.

Figure 9:
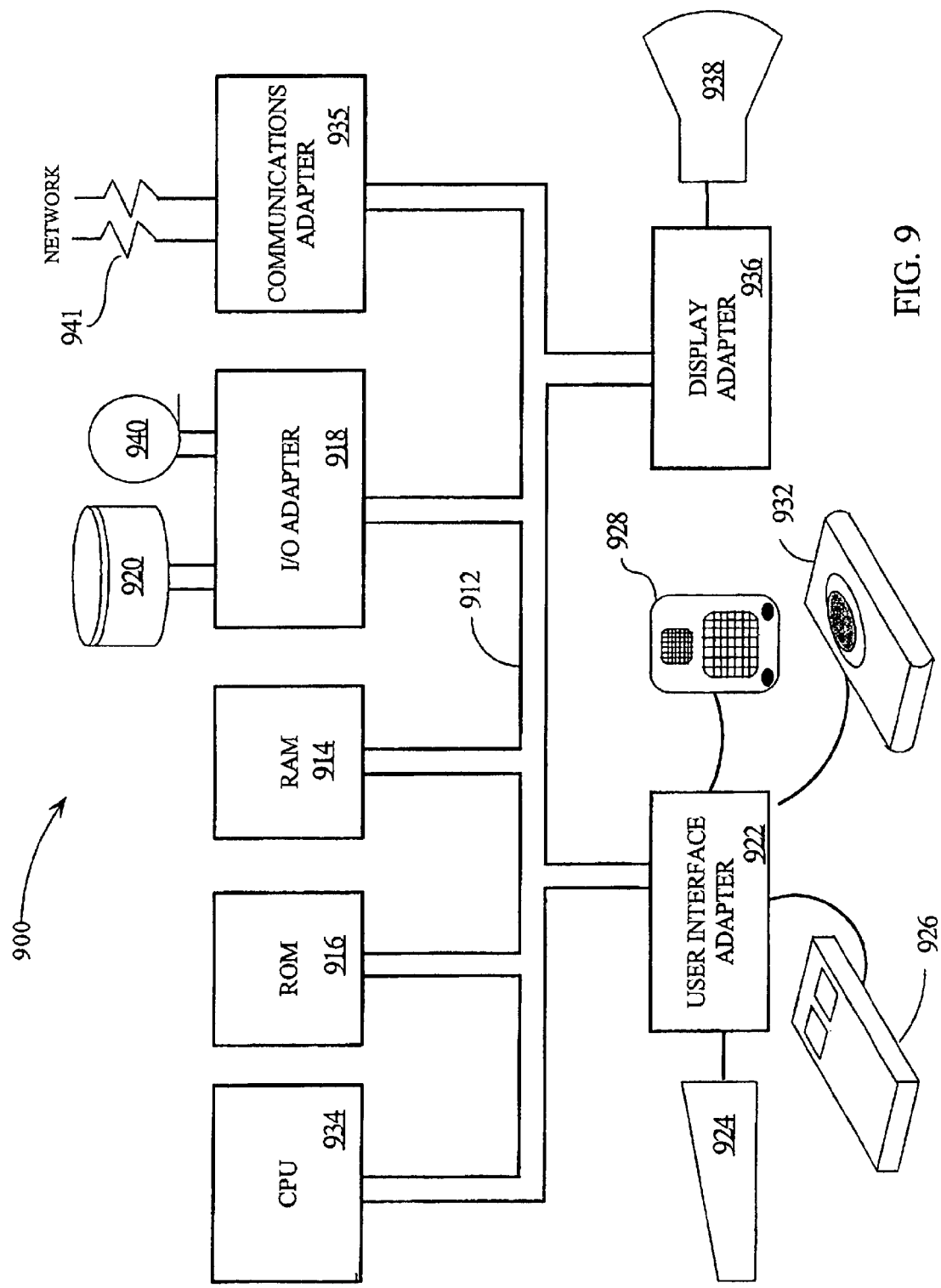
FIG. 9 is a data processing system suitable for practicing embodiments of the present invention.

A representative hardware environment for practicing the present invention is depicted in FIG. 9, which illustrates a typical hardware configuration of a workstation in accordance with the subject invention having central processing unit (CPU) 910 and a number of other units interconnected via system bus 912. The workstation shown in FIG. 9 includes random access memory (RAM) 914, read only memory (ROM) 916, and input/output (110) adapter 918 for connecting peripheral devices such as disk units 920 and tape drives 940 to bus 912, user interface adapter 922 for connecting keyboard 924, mouse 926, speaker 928, microphone 932, and/or other user interface devices such as a touch screen device (not shown) to bus 912, communication adapter 934 for connecting the workstation to a data processing network, and display adapter 936 for connecting bus 912 to display device 938. Cell library data for circuit macros may be stored in RAM 914 or in storage units 920 and 940. Circuit analysis and simulation programs may be run on CPU 934 to predetermine the leakage current dependencies of cells relative to process and environmental parameters. Likewise, CPU 934 may run a program to calculate the leakage currents for the macros according to embodiments of the present invention. In addition, CPU 934 may run software design programs that are used to design the circuit macros and partition them into circuit macros. The software design program may access leakage data obtained using embodiments of the present invention to direct a designer how leakage power is distributed across circuit macros. Data from these programs may be stored in RAM 914.

Although the present invention and its advantages have been described in detail, it should be understood that various changes, substitutions and alterations can be made herein without departing from the spirit and scope of the invention as defined by the appended claims.

What is claimed is:

1. A method for determining total leakage power for an integrated circuit (IC) having a plurality of circuit macros, comprising the steps of:
   a) estimating a present total macro power for each of said plurality of circuit macros;
   b) calculating a macro temperature for each of said plurality of circuit macros in response to said present total macro power using a multi-dimensional thermal model for a thermal structure for removing heat from said IC;
   c) calculating a macro voltage for each of said plurality of circuit macros in response to a current drawn by each of said macros using a multi-dimensional electrical model for a power distribution structure for delivering power from a power supply to said IC, wherein a value of said current is set as a function of said total macro power;
   d) calculating a present leakage power for each of said circuit macros in response to a corresponding macro temperature and macro voltage;
   e) calculating a present dynamic power for each of said plurality of said circuit macros in response to a corresponding macro temperature and macro voltage;
   f) calculating said present total macro power for each of said plurality of circuit macros in response to said present leakage power and said present dynamic power; and
   g) repeating steps b) through f) if said present leakage power has not converged to a final leakage power and stopping if said present leakage power has converged to said final leakage power for each of said plurality of circuit macros.

2. The method of claim 1 further comprising the step of adding said total macro power of each of said circuit macros generating said total leakage power.

3. The method of claim 1 wherein a macro voltage at each of said plurality of circuit macros is set to a nominal voltage during the step of estimating said total macro power.

4. The method of claim 1, wherein said current through said power distribution network has a value corresponding to said present total macro power divided by said macro voltage.

5. The method of claim 1, wherein said multi-dimensional power distribution model comprises a grid network having a multiplicity of circuit nodes coupled together with said resistor.

6. The method of claim 5, wherein said multi-dimensional power distribution network comprises three spatial dimensions.

7. The method of claim 1, wherein said multi-dimensional thermal model for removing heat from said IC comprises a thermal model for said IC, a thermal model for thermally coupling said IC to a corresponding electronic packaging and a thermal model for thermally coupling said IC to a corresponding heat sink.

8. The method of claim 7, wherein said thermal model for said IC, said thermal model for thermally coupling said IC to a corresponding electronic packaging, and said thermal model for thermally coupling said IC to a corresponding heat sink, wherein each model comprises a grid network having a multiplicity of nodes coupled together with thermal resistor elements.

9. The method of claim 1, wherein said macro temperature for each of said plurality of circuit macros is calculated using a linear solver to solve sets of equations defining said multi-dimensional thermal model.

10. The method of claim 1, wherein said macro voltage for each of said plurality of circuit macros is calculated using a linear solver to solve sets of equations defining said multi-dimensional power distribution network.

11. The method of claim 1, wherein said present leakage power for each of said plurality of circuit macros is calculated using a circuit analysis program having data relating leakage power as a function of process parameters, power supply voltage, circuit configurations, temperature, and logic states.

12. A computer program product for determining leakage power for an integrated circuit (IC) having a plurality of circuit macros, said computer program product embodied in a machine readable medium, including programming for a processor, said computer program comprising a program of instructions for performing the program steps of:
   a) receiving an estimated present total macro power for each of said plurality of circuit macros;
   b) calculating a macro temperature for each of said plurality of circuit macros in response to said present total macro power using a multi-dimensional thermal model for a thermal structure for removing heat from said IC;

c) calculating a macro voltage for each of said plurality of circuit macros in response to a current drawn by each of said macros using a multi-dimensional electrical model for a power distribution structure for delivering power from a power supply to said IC, wherein a value of said current is set as a function of said total macro power;

d) calculating a present leakage power for each of said circuit macros in response to a corresponding macro temperature and macro voltage;

e) calculating a present dynamic power for each of said plurality of said circuit macros in response to a corresponding macro temperature and macro voltage;

f) calculating said present total macro power for each of said plurality of circuit macros in response to said present leakage power and said present dynamic power; and g) repeating steps b) through f) if said present leakage power has not converged to a final leakage power and stopping if said present leakage power has converged to said final leakage power for each of said plurality of circuit macros.

13. The computer program product of claim 12 further comprising the step of adding said total macro power of each of said circuit macros generating said total leakage power.

14. The computer program product of claim 12 wherein a macro voltage at each of said plurality of circuit macros is set to a nominal voltage during the step of estimating said total macro power.

15. The computer program product of claim 12, wherein said current through said power distribution network has a value corresponding to said present total macro power divided by said macro voltage.

16. The computer program product of claim 12, wherein said multi-dimensional power distribution model comprises a grid network having a multiplicity of circuit nodes coupled together with said resistor.

17. The computer program product of claim 16, wherein said multi-dimensional power distribution network comprises three spatial dimensions.

18. The computer program product of claim 12, wherein said multi-dimensional thermal model for removing heat from said IC comprises a thermal model for said IC, a thermal model for thermally coupling said IC to a corresponding electronic packaging and a thermal model for thermally coupling said IC to a corresponding heat sink.

19. The computer program product of claim 18, wherein said thermal model for said IC, said thermal model for thermally coupling said IC to a corresponding electronic packaging, and said thermal model for thermally coupling said IC to a corresponding heat sink, wherein each model comprises a grid network having a multiplicity of nodes coupled together with thermal resistor elements.

20. The computer program product of claim 12, wherein said macro temperature for each of said plurality of circuit macros is calculated using a linear solver to solve sets of equations defining said multi-dimensional thermal model.

21. The computer program product of claim 12, wherein said macro voltage for each of said plurality of circuit macros is calculated using a linear solver to solve sets of equations defining said multi-dimensional power distribution network.

22. The computer program product of claim 12, wherein said present leakage power for each of said plurality of circuit macros is calculated using a circuit analysis program having data relating leakage power as a function of process parameters, power supply voltage, circuit configurations, temperature, and logic states.

* * * * *